United States Patent
Shin et al.

(10) Patent No.: US 9,064,921 B2
(45) Date of Patent: Jun. 23, 2015

(54) INACTIVE GAS INTRODUCING FACILITY AND INACTIVE GAS INTRODUCING METHOD

(71) Applicant: Daifuku Co., Ltd., Osaka-shi (JP)

(72) Inventors: Takeshi Shin, Gamo-gun (JP); Masahiro Takahara, Gamo-gun (JP); Toshihito Ueda, Gamo-gun (JP)

(73) Assignee: Daifuku Co., Ltd., Osaka-shi (JP)

( * ) Notice: Subject to any disclaimer, the term of this patent is extended or adjusted under 35 U.S.C. 154(b) by 351 days.

(21) Appl. No.: 13/733,393

(22) Filed: Jan. 3, 2013

(65) Prior Publication Data

US 2014/0014227 A1    Jan. 16, 2014

(30) Foreign Application Priority Data

Jan. 5, 2012   (JP) ................................. 2012-000722

(51) Int. Cl.
*H01L 21/67* (2006.01)
*H01L 21/677* (2006.01)
*H01L 21/673* (2006.01)

(52) U.S. Cl.
CPC .... *H01L 21/67772* (2013.01); *H01L 21/67393* (2013.01); *H01L 21/67769* (2013.01)

(58) Field of Classification Search
CPC ................... H01L 21/67769; H01L 21/67389; H01L 21/67393; H01L 21/67772
See application file for complete search history.

(56) References Cited

U.S. PATENT DOCUMENTS

| | | | |
|---|---|---|---|
| 7,134,825 B1 * | 11/2006 | Schmutz et al. | 414/217.1 |
| 7,248,353 B2 * | 7/2007 | Kimba et al. | 356/237.4 |
| 8,352,069 B2 * | 1/2013 | Kawasaki | 700/228 |
| 2014/0305540 A1 * | 10/2014 | Oyama et al. | 141/4 |
| 2014/0366983 A1 * | 12/2014 | Takahara et al. | 141/197 |
| 2015/0000591 A1 * | 1/2015 | Kawasaki et al. | 118/695 |

FOREIGN PATENT DOCUMENTS

JP    2001338971 A    12/2001

* cited by examiner

*Primary Examiner* — Timothy L Maust
*Assistant Examiner* — Timothy P Kelly
(74) *Attorney, Agent, or Firm* — The Webb Law Firm (57) ABSTRACT

An inactive gas introducing facility includes an introducing device for introducing inactive gas to the inside of a container stored in a storage section of a storage shelf with discharging gas present inside the container to the inside of a storage space partitioned from the outside and a controller for controlling operation of the introducing device. In a normal stop mode, the controller controls the operation of the introducing device to stop feeding of inactive gas to the container in response to detection of an opened state of an inspection door. And, in a stop nullification mode, the controller controls the operation of the introducing device to continue feeding of inactive gas to the container even in response to detection of the opened state of the inspection door.

10 Claims, 5 Drawing Sheets

INACTIVE GAS INTRODUCING FACILITY AND INACTIVE GAS INTRODUCING METHOD

FIELD OF THE INVENTION

The present invention relates to an inactive gas introducing facility including a storage shelf disposed in a storage space partitioned from the outside and having storage sections each storing a container for accommodating a substrate, an introducing device for introducing inactive gas to the inside of the container stored in the storage section through a gas feed opening of the container with discharging gas present inside the container to the inside of the storage space through a gas discharge opening of the container and a controller for controlling operation of the introducing device. The invention relates also to an inactive gas introducing method utilizing such inactive gas introducing facility.

BACKGROUND ART

The inactive gas introducing facility described above is used for e.g. introducing an amount of inactive gas into a container accommodating a substrate (such as a semiconductor wafer) for the purpose of restricting unwanted adhesion and accumulation of particles on the substrate thereby to avoid deterioration of the substrate from its proper state due to oxygen and/or humidity.

More particularly, in association with the introduction of inactive gas through the gas feed opening of the container accommodating the substrate, gas present inside the container will be discharged to the inside of a storage space through a gas discharge opening of the container and the interior of the container will be filled with the introduced inactive gas eventually. Therefore, unwanted adhesion of particles on the substrate and deterioration of the substrate from its proper state due to oxygen and/or humidity are restricted.

Japanese Unexamined Patent Application Publication No. 2001-338971 (Patent Document 1) discloses an example of such inactive gas introducing facility. With this inactive gas introducing facility, a plurality of storing sections as storage sections are disposed in juxtaposition along the vertical and right/left directions within a box-like storage and each storing section includes a gas feed pipe for feeding nitrogen gas as inactive gas.

Though not detailed in Patent Document 1 above, the interior of the box-like storage corresponds to "a storage space partitioned from the outside" and into this box-like storage, the nitrogen gas is discharged from a container.

In the inactive gas introducing facility, there is generally provided an inspection door for allowing access by a worker to/from the inside of the storage space in order to carry out various inspection operations.

In case such inspection door is provided, in order to restrict discharge of inactive gas to the inside of the storage space through the gas discharge opening of the container stored in the storage section, it is conceivable to arrange such that feeding of inactive gas is stopped in response to opening of the inspection door.

However, with the simple arrangement of stopping feeding of inactive gas in response to opening of the inspection door, inspection operations with feeding of inactive gas, such as inspection operation of feeding state of inactive gas to the gas feed opening of the container stored in the storing section, inspection operation of the discharge state of the inactive gas through the gas discharge opening of the container are not possible.

SUMMARY OF THE INVENTION

In view of the above-described background, there is a need for realizing an inactive gas introducing facility that allows not only inspection operations with stopping of inactive gas feeding, but also inspection operations with continued feeding of inactive gas.

An inactive gas introducing facility according to the present invention comprises:

a storage shelf disposed in a storage space partitioned from the outside and having storage sections each storing a container for accommodating a substrate;

an introducing device for introducing inactive gas to the inside of the container stored in the storage section through a gas feed opening of the container with discharging gas present inside the container to the inside of the storage space through a gas discharge opening of the container;

a controller for controlling operation of the introducing device;

an inspection-door opening/closing detecting device for detecting an opened/closed state of an inspection door allowing access of a worker to/from the inside of the storage space; and a manual operation type stop nullification commanding device for issuing a stop nullification command to the controller;

wherein in a normal stop mode which is executed when the stop nullification command is not issued by the stop nullification commanding device, the controller controls the operation of the introducing device to stop feeding of inactive gas to the container if the inspection-door opening/closing detecting device detects an opened state of the inspection door; and in a stop nullification mode which is executed when the stop nullification command is issued by the stop nullification commanding device, the controller controls the operation of the introducing device to continue feeding of inactive gas to the container even if the inspection-door opening/closing detecting device detects the opened state of the inspection door.

With the above-described arrangement, in carrying out e.g. inspection of the feeding state of inactive gas to the gas feed opening of the container stored in the storage section, inspection of the discharging state of inactive gas through the gas discharge opening of the container, etc. as an inspection with feeding of inactive gas, as the stop nullification commanding device issues a stop nullification command to the controller, the state of feeding inactive gas to the container can be contained even if the inspection door is opened. As a result, the inspection operation can be carried out with the feeding of inactive gas to the container being continued.

Further, in case feeding of inactive gas to the container is not needed at the time of inspection operation, as the stop nullification commanding device does not issue a stop nullification command to the controller, if the inspection-door opening/closing detecting device detects the opened state of the inspection door, the feeding of inactive gas to the container is stopped. As a result, the inspection operation can be carried out with the feeding of inactive gas to the container being stopped.

In short, with the above-described arrangement, there can be provided an inactive gas introducing facility that allows not only an inspection operation with feeding of inactive gas being stopped, but also an inspection operation with feeding of inactive gas being continued.

The technical features of the inactive gas introducing facility relating to the present invention is applicable also to an inactive gas introducing method; hence, the invention can claim such method in its scope for protection. With this inactive gas introducing method too, the same advantageous effect achieved by the above-described inactive gas introducing facility can be achieved.

That is, according to the present invention, an inactive gas introducing method utilizing an inactive gas introducing facility including a storage shelf disposed in a storage space partitioned from the outside and having storage sections each storing a container for accommodating a substrate;

an introducing device for introducing inactive gas to the inside of the container stored in the storage section through a gas feed opening of the container with discharging gas present inside the container to the inside of the storage space through a gas discharge opening of the container;

a controller for controlling operation of the introducing device;

an inspection-door opening/closing detecting device for detecting an opened/closed state of an inspection door allowing access of a worker to the inside of the storage space; and a manual operation type stop nullification commanding device for issuing a stop nullification command to the controller;

the method comprising the following step that is effected by the controller:

a feeding state controlling step wherein in a normal stop mode which is executed when the stop nullification command is not issued by the stop nullification commanding device, the operation of the introducing device is controlled to stop feeding of inactive gas to the container if the inspection-door opening/closing detecting device detects an opened state of the inspection door; and wherein in a stop nullification mode which is executed when the stop nullification command is issued by the stop nullification commanding device, the operation of the introducing device is controlled to continue feeding of inactive gas to the container even if the inspection-door opening/closing detecting device detects the opened state of the inspection door.

Next, preferred embodiments of the present invention will be explained.

According to a preferred embodiment of the inactive gas introducing facility relating to the present invention, there is provided an oxygen concentration detecting sensor for detecting an oxygen concentration inside the storage space; and if the oxygen concentration detecting sensor detects an oxygen concentration below a set value while feeding of inactive gas to the container is continued in the stop nullification mode, the controller controls the operation of the introducing device to stop feeding of the inactive gas to the container.

With the above-described arrangement, in the stop nullification mode, if the oxygen concentration inside the storage space falls below the set value due to discharging of inactive gas into the storage space via the gas discharge opening of the container, feeding of inactive gas to the container will be stopped, so that safety for the worker can be ensured.

That is, the storage space is not formed to be completely sealed in order to discharge gas discharged from the container to the outside, but the storage space is appropriately open to be capable of communicating air with the outside space.

Further, when an inspection operation is to be carried out, the inspection door will be kept under the opened state. Therefore, even if inactive gas is discharged into the storage space through the gas discharge opening of the container, there is not much possibility of the oxygen concentration inside the storage space falling too sharply to be below the set value. However, if the oxygen concentration inside the storage space should fall below the set value, the safety for the worker can be ensured with stopping of feeding of inactive gas to the container.

According to a further preferred embodiment of the inactive gas introducing facility relating to the present invention, in the stop nullification mode, when feeding of inactive gas to the container is to be continued after detection of the opened state of the inspection door by the inspection-door opening/closing detecting device, the controller activates a notifying device for notifying continuation of feeding of inactive gas to the worker.

With the above-described arrangement, when the worker is to carry out an inspection operation inside the storage space, the worker can accurately understand that feeding of inactive gas to the container is being continued. Therefore, the worker can carry out the inspection operation appropriately with the recognition of the feeding of inactive gas to the container being continued.

Incidentally, as the notifying device, it is possible to employ an arrangement that continuation of feeding of inactive gas is notified to a portable terminal such as a mobile phone carried by the worker or an arrangement that continuation of feeding of inactive gas is notified through a speaker provided adjacent the inspection door, etc.

According to a further preferred embodiment of the inactive gas introducing facility relating to the present invention, if the inspection-door opening/closing detecting device does not detect the opened state of the inspection door even after lapse of a set period after switchover to the stop nullification mode in response to the stop nullification command from the stop nullification commanding device, the controller releases the stop nullification mode and switches it over to the normal stop mode.

With the above-described arrangement, for instance, even when the worker issues the stop nullification command to the controller via the stop nullification commanding device in order to carry out an inspection operation with feeding operation of inactive gas to the container being continued and then the worker decides to cancel this inspection operation for some reason, the stop nullification mode will be cancelled and switched over to the normal stop mode automatically. Therefore, unnecessary continuation of the stop nullification mode can be avoided.

That is, if the stop nullification mode is continued, when the worker erroneously believing the current mode being the normal stop mode opens the inspection door and enters the storage space, the state of feeding inactive gas to the container will be continued, in spite of the worker's understanding to the contrary. The above arrangement can avoid occurrence of such inconvenience.

According to a further preferred embodiment of the inactive gas introducing facility relating to the present invention, the stop nullification commanding device includes an operational member selectively operable between an operation canceling position and a nullification commanding position and urged to return to the operation canceling position; and the stop nullification command is issued to the controller when the operational member is operated to the nullification commanding position.

When the operational member is not urged to return to the operation canceling position and the stop nullification mode will be cancelled and automatically switched over to the normal stop mode, the worker who saw the operational member maintained at the nullification commanding position may erroneously believe that the stop nullification mode being currently executed. With the above-described arrangement, such misunderstanding by the worker of the mode being currently the stop nullification mode can be avoided.

According to a preferred embodiment of the inactive gas introducing method relating to the present invention, the inactive gas introducing facility further includes an oxygen concentration detecting sensor for detecting an oxygen concentration inside the storage space; and at the feeding state controlling step, if the oxygen concentration detecting sensor detects an oxygen concentration below a set value while feeding of inactive gas to the container is continued in the stop nullification mode, the operation of the introducing device is controlled to stop feeding of the inactive gas to the container.

According to a still preferred embodiment of the inactive gas introducing method relating to the present invention, at the feeding state controlling step, when feeding of inactive gas to the container is to be continued after detection of the opened state of the inspection door by the inspection-door opening/closing detecting device, a notifying device is activated for notifying the continuation of feeding of inactive gas to the worker.

According to a still preferred embodiment of the inactive gas introducing method relating to the present invention, at the feeding state controlling step, if the inspection-door opening/closing detecting device does not detect the opened state of the inspection door even after lapse of a set period after switchover to the stop nullification mode in response to the stop nullification command from the stop nullification commanding device, the stop nullification mode is released and then switched over to the normal stop mode.

According to a still preferred embodiment of the inactive gas introducing method relating to the present invention, the stop nullification commanding device includes an operational member selectively operable between an operation canceling position and a nullification commanding position and urged to return to the operation canceling position; and the stop nullification command is issued to the controller when the operational member is operated to the nullification commanding position.

DETAILED DESCRIPTION

Next, embodiments of the present invention as being applied to an article storage facility will be explained with reference to the accompanying drawings.

(General Construction)

Figure 1:
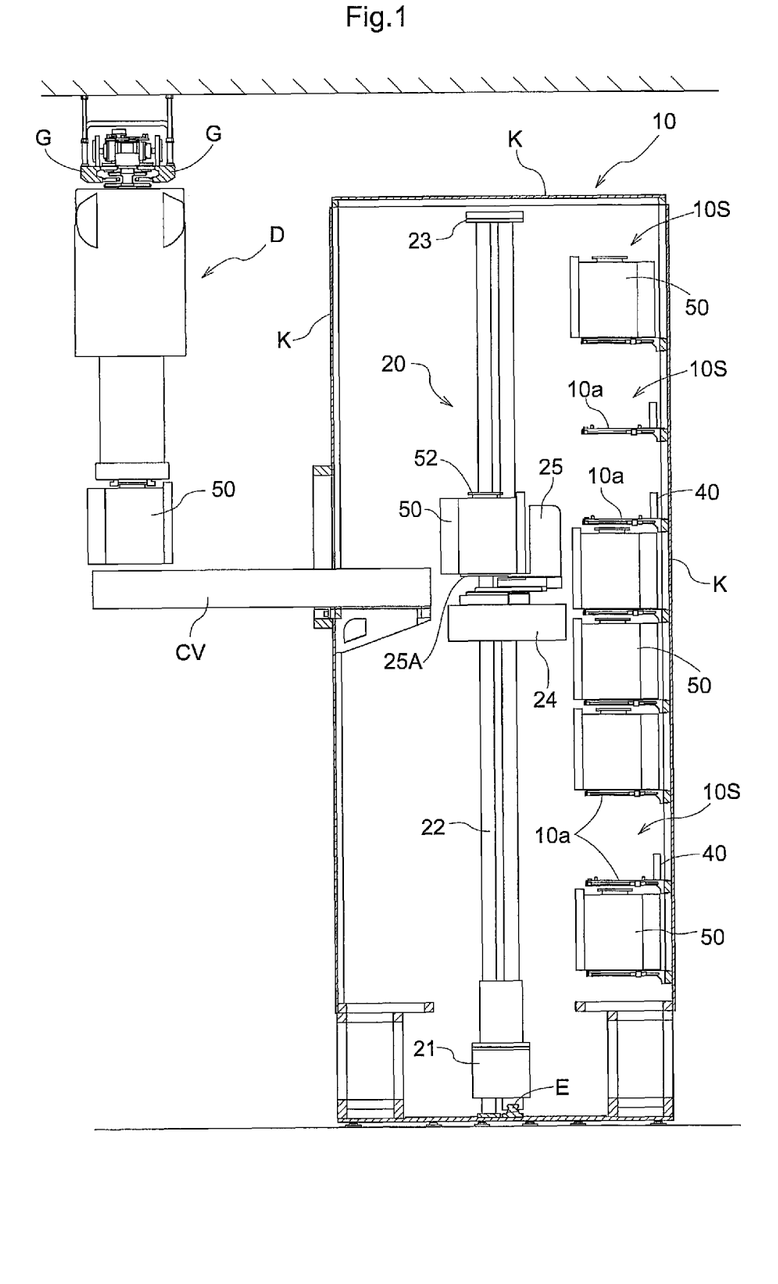
FIG. 1 is a front view in vertical section showing an article storage facility.
Figure 2:
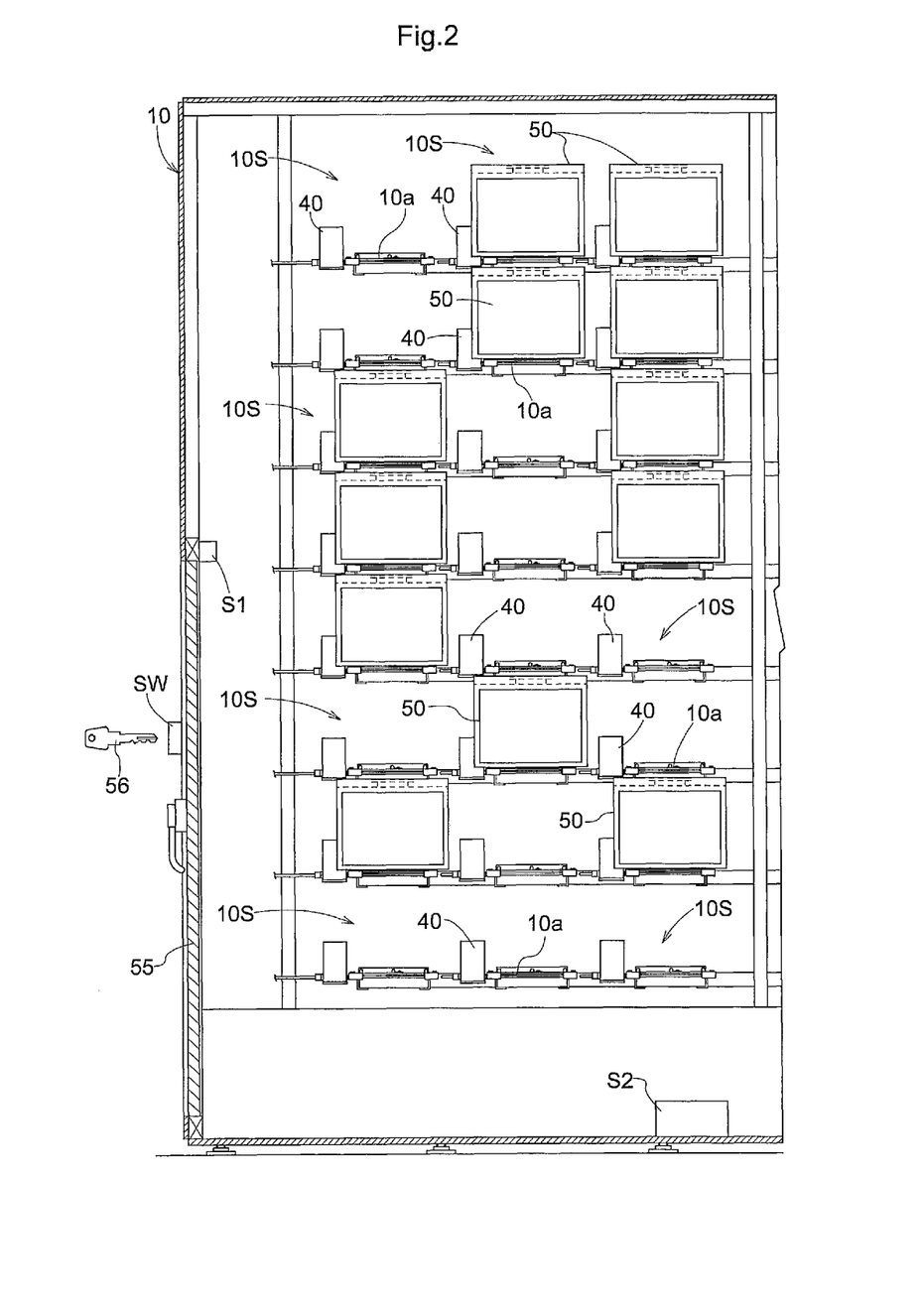
FIG. 2 is a cutaway side view showing the facility.

An article storage facility, as shown in FIG. 1 and FIG. 2, includes a storage shelf 10 for storing transport containers 50 (to be referred to shortly as "containers 50" hereinafter) each accommodating substrates therein under a sealed state, a stacker crane 20 as a transport device, and a carry in/out conveyor CV as a carry in/out section for the containers 50.

The storage shelf 10 and the stacker crane 20 are disposed in a storage space partitioned from the outside with a wall body K and the carry in/out conveyor CV is disposed to extend through the wall body K.

The storage shelf 10 includes a plurality of storage sections 10S, as support portions for supporting the containers 50, juxtaposed along the vertical direction and the right/left direction, each of the plurality of storage sections 10S being configured to store the container 50. The details of this will be explained later.

And, in the instant embodiment, as shown in FIG. 1, there is mounted a hoist-type transport carriage D which travels along a guide rail G attached to the ceiling portion of a cleanroom in which the article storage facility is installed. By this hoist type transport carriage D, the container 50 can be carried in/out relative to the carry in/out conveyer CV.

(Construction of Container 50)

The container 50 is a gas-sealed container made of synthetic resin in compliance with the SEMI (Semiconductor Equipment and Material Institute) standard and is used for accommodating a semiconductor wafer W (see FIG. 4) as a substrate. This container 50 is referred to as a FOUP (Front Opening Unified Pod). And, though not detailed herein, in the front face of the container 50, there is formed an opening which can be opened/closed with a detachable lid for carrying in/out substrates. In the upper face of the container 50, there is formed a top flange 52 (see FIG. 4) which can be gripped by the hoist type transport carriage D. In the bottom face of the container 50, there are formed three engagement grooves (not shown) engageable by positioning pins 10b (see FIG. 3).

Figure 4:
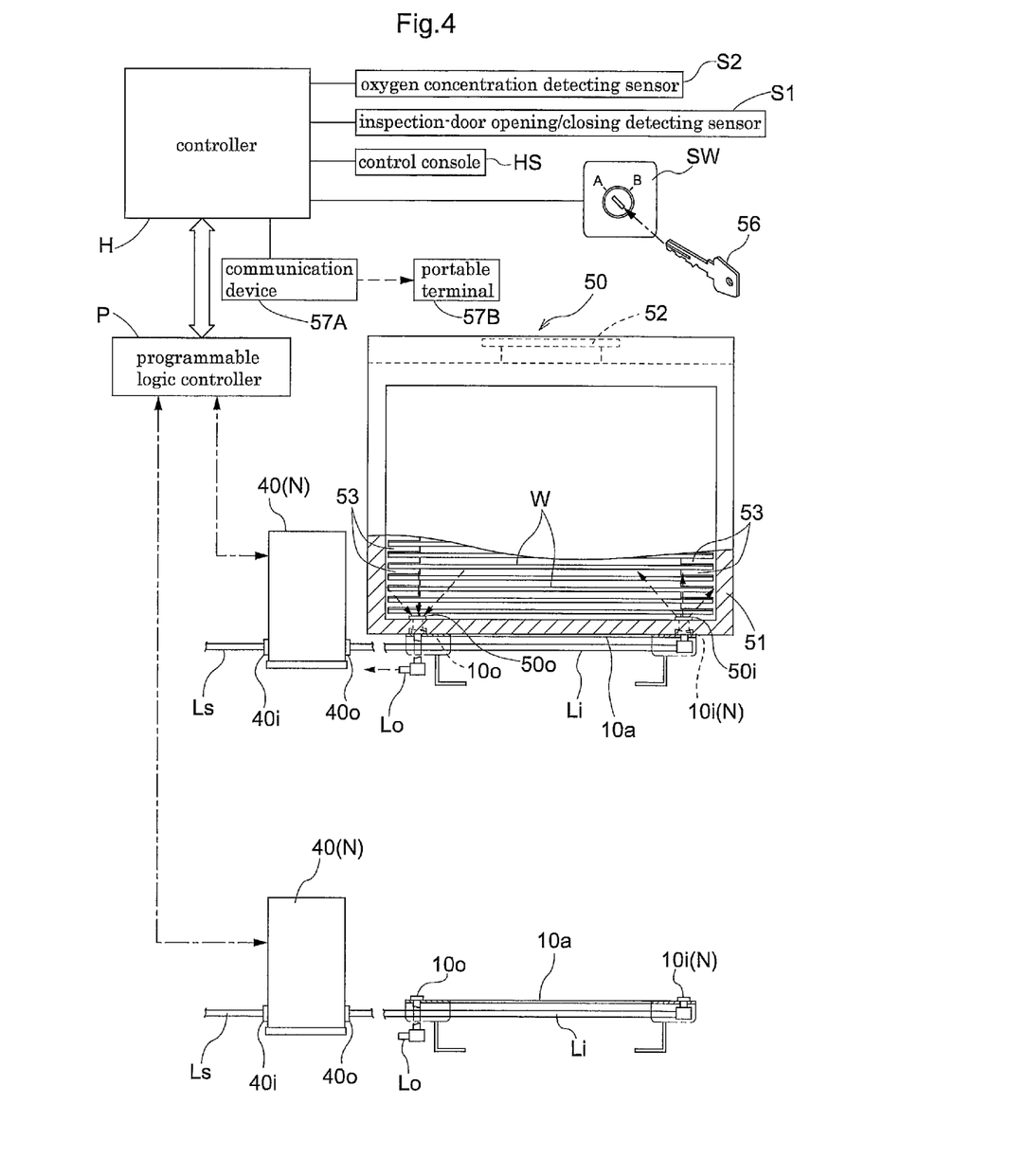
FIG. 4 is an explanatory view illustrating an introducing condition of nitrogen gas.

More particularly, the container 50, as shown in FIG. 4, includes a casing 51 having substrate supports 53 capable of loading a plurality of semiconductor wafers W at different vertical positions therein and an unillustrated lid. The container 50 is configured such that the inner space thereof is sealed gas-tightly when the lid is attached to the casing 51. And, when the container 50 is stored in the storage section 10S, the container 50 is fixed in position by the positioning pins 10b.

Further, as shown in FIG. 4, in the bottom of the container 50, there are provided a gas feed opening 50i for introducing an amount of nitrogen gas as an inactive gas and a gas discharge opening 50o. Though not shown, at the gas feed opening 50i, there is provided an introducing side opening/closing valve: and at the gas discharge opening 50o, there is provided a discharging side opening/closing valve.

The introducing side opening/closing valve is urged in its closing direction by means of an urging member such as a spring. In operation, when the discharge pressure of nitrogen gas fed to the gas feed opening 50i becomes higher than a set valve opening pressure higher than the atmospheric pressure by a set value, the introducing side opening/closing valve is opened by this pressure.

Further, the discharging side opening/closing valve is urged by an urging member such as a spring in the closing direction, so that when the pressure inside the container 50 reaches a pressure higher than a set valve opening pressure higher than the atmospheric pressure by a set value, the valve is opened by this pressure.

(Construction of Stacker Crane 20)

The stacker crane 20, as shown in FIG. 1, includes a traveling carriage 21 which can run along a traveling rail E installed on the floor on the side of the front face of the storage shelf 10, a mast 22 mounted erect on the traveling carriage 21, and a lift deck 24 which can move up/down as being guided by the mast 22.

Incidentally, though not shown, an upper frame 23 provided at the upper end of the mast 22 is movable as being engaged with an upper guide rail attached to the ceiling of the storage space having its outer periphery covered by the wall body K.

On the lift deck 24, there is mounted a transfer device 25 for transferring the container 50 to/from the storage section 10S.

The transfer device 25 includes a plate-like loading support body 25A which loads and supports the container 50 thereon, with the loading support body 25A being projectable and retractable between a projecting position projecting into the storage section 10S and a retracted position retracted toward the lift deck 24 side. The stacker crane 20 including the transfer device 25 is configured to effect an unloading operation for unloading the container 50 loaded on the loading support body 25A onto the storage section 10S, and a retrieving operation for retrieving the container 50 stored in the storage section 10S, in association with projecting/retracting operations of the loading support body 25A and lifting up/down operations of the lift deck 24.

Incidentally, the stacker crane 20 having the transfer device 25 effects also unloading and retrieving operations relative to the carry in/out conveyer CV, thus effecting transfer operations relative to the carry in/out conveyer CV.

The stacker crane 20, though not shown, includes a traveling position detector for detecting the traveling position on the traveling passage and a lifting position detector for detecting the lifting position of the lift deck 24. So that, based on detection information of the traveling position detector and the lifting position detector, a crane controller (not shown) for controlling operations of the stacker crane 20 controls the operations of the stacker crane 20.

More particularly, in order to effect a carry-in operation for carrying a container 50 carried into the carry in/out conveyer CV into the storage section 10S and a carry-out operation for carrying the container 50 stored in the storage section 10S out onto the carry in/out conveyer CV, the crane controller controls the traveling operation of the traveling carriage 21, the lifting operation of the lift deck 24 and the projecting/retracting operations of the loading support body 25A of the transfer device 25.

(Construction of Storage Section 10S)

Figure 3:
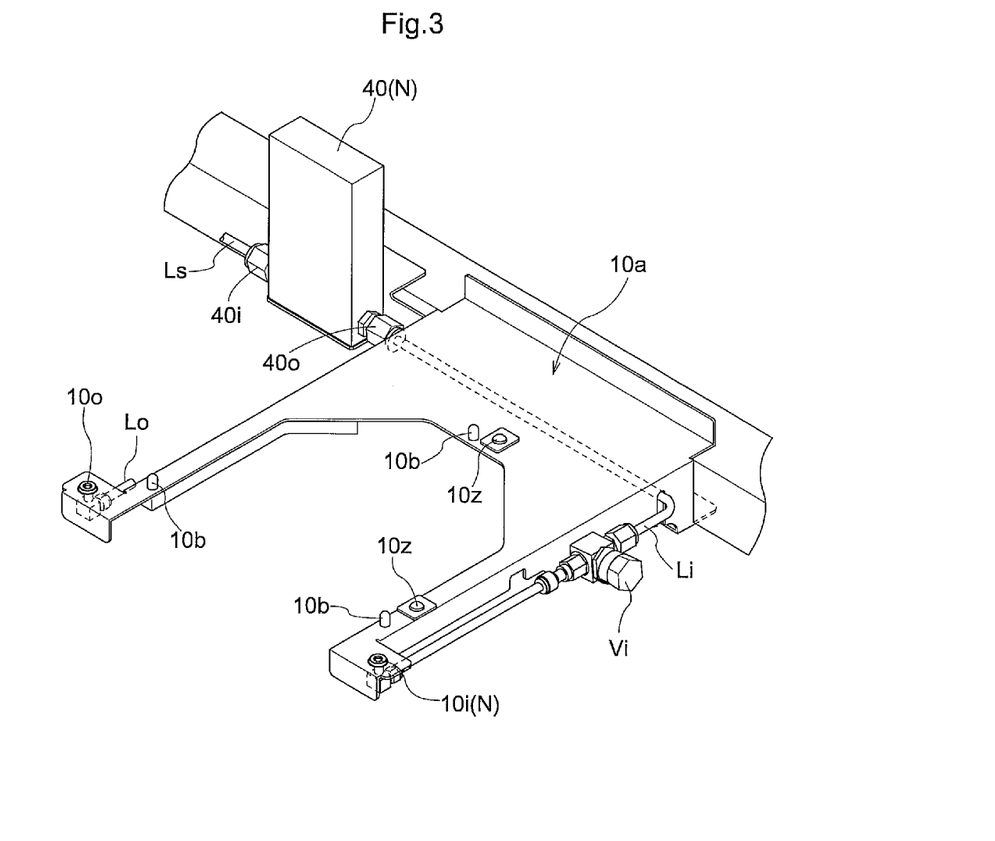
FIG. 3 is a perspective view showing a storage section.

As shown in FIG. 3 and FIG. 4, each one of the plurality of storage sections 10S includes a plate-like loading support portion 10a for loading and supporting the container 50 thereon (see FIG. 1).

This loading support portion 10a has an U-shape as viewed in the plane view thereof so as to form a space for allowing vertical passage of the loading support body 25A of the transfer device 25, and in the upper face, the afore-mentioned positioning pins 10b project upwards therefrom.

Further, the loading support portion 10a includes a pair of load presence sensors 10z for detecting whether the container 50 is loaded or not (that is, whether a container 50 is stored in the storage section 10S or not). And, detection information thereof are inputted to a controller H (see FIG. 4) for managing the operation of a mass flow controller 40 which will be described later.

The loading support portion 10a further includes a discharge nozzle 10i for feeding nitrogen gas as an inactive gas into the container 50 and a discharging gas passage body 10o to be passed by a gas discharged from the inside of the container 50. Further, each storage section 10S mounts the mass flow controller 40 for controlling feeding of the nitrogen gas (see FIG. 2).

And, the discharge nozzle 10i is connected to a feed piping Li for flowing the nitrogen gas from the mass flow controller 40 and to the discharging gas passage body 10o, there is connected a discharge pipe Lo having an open end.

When the container 50 is loaded and supported on the loading support portion 10a, the discharge nozzle 10i is connected under an engaged state to the gas feed opening 50i of the container 50 and the discharging gas passage body 10o is connected under an engaged state to the gas discharge opening 50o of the container 50.

Then, under the condition of the container 50 being loaded and supported on the loading support portion 10a, nitrogen gas is discharged from the discharge nozzle 10i at a pressure higher than the atmospheric pressure by a set value, whereby the gas present inside the container 50 is discharged through the gas discharge opening 50o to the outside and the nitrogen gas can be introduced to the inside of the container 50 through the gas feed opening 50i of the container 50.

Incidentally, as shown in FIG. 3, the feed piping Li incorporates a manual operation type opening/closing valve Vi, such that a change of condition to stop the feeding of the nitrogen gas may be realized at the time of e.g. an emergency due to malfunctioning of the mass flow controller 40.

(Construction of Mass Flow Controller 40)

As shown in FIG. 3 and FIG. 4, the mass flow controller 40 includes an introducing side port 40i and a discharging side port 40o. To the discharging side port 40o, the feed piping Li is connected. And, to the introducing side port 40i, there is connected an introducing side piping Ls for guiding nitrogen gas from a nitrogen gas feed source (not shown) such as a nitrogen gas cylinder.

Incidentally, the nitrogen gas feed source includes a governor for adjusting the feed pressure of the nitrogen gas to a set pressure higher than the atmospheric pressure by a set value, a manual operation type opening/closing valve for allowing/inhibiting feeding of the nitrogen gas, etc.

The mass flow controller 40 includes a feed rate adjusting valve for variably adjusting the feed rate of the nitrogen gas (the feed rate to the container 50) which flows in the inner passage from the introducing side port 40i to the discharging side port 40o, a feed rate sensor for determining the feed rate of the nitrogen gas (the feed rate to the container 50) which flows in the inner passage, and an internal control unit for controlling the operations of the feed rate adjusting valve.

And, the internal control unit is configured to control the feed rate adjusting valve based on the detection information from the feed rate sensor so as to adjust the feed rate to the container 50 to a target feed rate commanded from the aforementioned controller H. More particularly, the internal control unit controls the feed rate adjusting valve in such a manner as to cause the feed rate to the container 50 to comply with a feed rate command issued from the controller H.

In the instant embodiment, the mass flow controller 40 adjusts the feed rate of the nitrogen gas flowing in the internal passage (the feed rate to the container 50) between zero and 50 liters/min. The mass flow controller 40 employed in the instant embodiment is configured to adjust the feed rate to a target feed rate (feed rate command) commanded by the controller H in the entire feed rate adjustment range at a high speed (e.g. within 1 second).

Incidentally, in the instant embodiment, the introducing device N for introducing nitrogen gas as an inactive gas from the gas feed opening 50i of the container 50 to the interior of the container 50 with discharging the gas inside the container 50 to the outside through the gas discharge opening 50o includes the nitrogen gas source, the mass flow controller 40 and the discharge nozzle 10i as its principal components and the controller H controls the operations of the introducing device N. And, the introducing device N is configured to be capable of varying the feed rate of the nitrogen gas as an inactive gas in accordance with the feed rate command from the controller H.

(Target Feed Rate of Controller H)

The controller H, as shown in FIG. 4 commands, via a programmable logic controller P, a target feed rate (feed rate command) to the mass flow controller 40 provided in correspondence with each one of the plurality of storage sections 10S.

Incidentally, the controller H is provided with a control console HS for allowing inputs of various kinds of information.

The target feed rate commanded by the controller H includes, as some non-limiting examples thereof, a target feed rate for storage to be commanded to the mass flow controller 40 in order to introduce nitrogen gas into the container 50 when this container 50 is accommodated in the storage section 10S, a target feed rate for nozzle cleaning to be commanded in order to clean the discharge nozzle 10i immediately before the container 50 is accommodated in the storage section 10S, and a target feed rate for cleaning to be commanded in order to clean the discharge nozzle 10i, the feed piping Li, etc. at the time of e.g. installment of the storage shelf 10. Specifically, the controller H commands to the mass flow controller 40 (introducing device N) a feed rate command for adjusting the feed rate of the nitrogen gas to the container 50 to a target feed rate for storage, a target feed rate for nozzle cleaning, or a target feed rate for cleaning.

More particularly, in response to issuance of a cleaning start command via the control console HS at the time of e.g. installment of the storage shelf 10, the controller H commands to the mass flow controller 40 a target feed rate (feed flow rate) for nozzle cleaning for a set period.

Also, upon carry-in of the container 50 to the carry in/out conveyer CV, the controller H commands to the mass flow controller 40 the target feed rate for nozzle cleaning for the set period.

Further, when the two load presence sensors 10z detect the container 50, the controller H commands a target feed rate for storage to the mass flow controller 40.

In the instant embodiment, as the target feed rates for storage, there are set an initial target feed rate and a steady-state target feed rate smaller than the initial target feed rate. When feeding of nitrogen gas is to be started after storage of the container 50 in the storage section 10S, the controller H commands firstly the initial target feed rate as the target feed rate for storage for the set period and then commands the steady-state target feed rate as the target feed rate for storage.

Incidentally, the pattern for commanding a target feed rate for storage is not limited to the above. For instance, in case the steady-state target feed rate is commanded as the target feed rate for storage as described above, there may be employed a pattern for feeding nitrogen gas intermittently at the steady-state target feed rate. In this case, commanding of the steady-state target feed rate as the target feed rate for the set feed period and commanding of zero feed rate as the target feed rate for the set standby period are alternatively executed. Further alternatively, the pattern may be a pattern that sets only the steady-state target feed rate without setting the initial target feed rate and intermittently feeding nitrogen gas at this steady-state target feed rate. In these ways, various storage patterns may be employed as the pattern of commanding target feed rate for storage.

(Nitrogen Feeding Stopping Control)

In the instant embodiment, the controller H executes a nitrogen feeding stopping control when an inspection door 55 (see FIG. 2) for allowing access by a worker into/out of the storage space is opened. In this nitrogen feeding stopping control, basically, feeding of nitrogen gas by the introducing device N to all of the stored containers 50 is stopped. As will be described below, in this nitrogen feeding stopping control, feeding of nitrogen gas to the containers 50 may sometimes be continued, even when the inspection door 55 is opened.

Incidentally, the inspection door 55 which was opened for an inspection operation will be maintained under the opened state, during the inspection operation for introducing ambient air to the inside of the storage space. And, upon completion of the inspection operation, the inspection door 55 will be closed.

As shown in FIG. 2 and FIG. 4, there are provided an inspection-door opening/closing detecting sensor S1 as an "inspection-door opening/closing detecting device" for detecting an opened/closed state of the inspection door 55 and a stop nullification commanding switch SW as a "manual operation type stop nullification commanding device" for issuing a stop nullification command to the controller H.

The inspection-door opening/closing detecting sensor S1 is comprised of e.g. a limit switch or the like which is depressed by the inspection door 55. This sensor S1 detects whether the inspection door 55 is under a closed state in which the door is at the completely closed position or an opened state in which the door is operated from the completely closed position toward the open side and outputs this detection information to the controller H.

The stop nullification commanding switch SW is disposed e.g. on the outer face of the wall member K adjacent the inspection door 55, and as shown in FIG. 4, includes a key 56 as an "operational member" that can be inserted to or withdrawn from the main body. The key 46 inserted to the main body is selectively operable to an operation canceling position A and a nullification commanding position B and the key 56 as being inserted to the main body is urged to return to the operation canceling position A.

And, the stop nullification commanding switch SW is configured to issue a stop nullification command to the controller H when the key 45 is operated to the nullification commanding position B.

Incidentally, the stop nullification commanding switch SW can be a so-called selector switch, i.e. a switch having an operational knob as the operational member.

The controller H is configured to set, as an execution mode, a stop nullification mode when a stop nullification command is outputted from the stop nullification commanding switch SW or a normal stop mode when no stop nullification command is outputted from the stop nullification commanding switch SW.

In the normal stop mode, the controller H controls the operation of the introducing device N so as to stop feeding of nitrogen gas to all the container 50, when the inspection-door opening/closing detecting sensor S1 detects the opened state of the inspection door 55. Specifically, the controller H sets the target feed rates to the plurality of mass flow controllers 40 provided in corresponding to the plurality of storage sections 10S to zero.

Further, in the stop nullification mode, the controller H controls the operation of the introducing device N to continue feeding of nitrogen gas to the containers 50 even when the inspection-door opening/closing detecting sensor S1 detects the opened state of the inspection door 55. Specifically, the controller H continues commanding of the target feed rates for storage to the mass flow controller 40 as described above. (Ancillary Control)

As described above, in the stop nullification mode, even when the inspection door 55 is opened, feeding of nitrogen gas to the container 50 is continued. In the instant embodiment, as control arrangements ancillary thereto, there are provided following control arrangements.

In case the controller H continues feeding of inactive gas to the containers 50 even when the inspection-door opening/closing detecting sensor S1 has detected the opened state of the inspection door 55, as shown in FIG. 4, the controller H activates a wireless type communication device 57A as a "notifying device" for notifying the worker of the continuation of feeding of nitrogen gas.

More particularly, the communication device 57A is configured to transmit a message indicating the continuation of feeding of nitrogen gas to a portable terminal 57B such as a mobile phone carried by the worker. Then, the portable terminal 57B either displays the received message on a display screen or outputs the received message as a voice message, thereby to notify the worker that feeding of nitrogen gas is being continued.

Further, if the inspection-door opening/closing detecting sensor S1 does not yet detect the opened state of the inspection door 55 even after lapse of a set period (e.g. 5 minutes) after switchover to the stop nullification mode in response to a stop nullification command from the stop nullification commanding switch SW, the controller H releases the stop nullification mode and switches it over to the normal stop mode.

That is, the above arrangement is provided for avoiding such a situation that the stop nullification mode is continued inadvertently in case the worker once commanded the stop nullification command via the stop nullification commanding switch SW in order to carry out an inspection operation and then decided to cancel this inspection operation.

Further, as shown in FIG. 2, there is provided an oxygen concentration detecting sensor S2 for detecting the oxygen concentration in the storage space partitioned from the outside by the wall member K, and as shown in FIG. 4, detection information of this oxygen concentration detecting sensor S2 is inputted to the controller H.

Incidentally, in FIG. 2 and FIG. 4, there is shown an exemplary arrangement in which one oxygen concentration detecting sensor S2 is provided. However, it is preferred that a plurality of oxygen concentration sensors S2 be disposed in distribution at a plurality of positions inside the storage space.

And, if the oxygen concentration detected by the oxygen concentration detecting sensor S2 falls blow a set value during continuation of nitrogen gas feeding to the containers 50 in the stop nullification mode, the controller H controls the operation of the introducing device N so as to stop feeding of nitrogen gas to the containers 50. More particularly, the controller H sets the target feed rates to be commanded to the plurality of mass flow controllers 40 provided in correspondence with the plurality of storage sections 10S to zero.

Incidentally, in the case of the alternative arrangement wherein a plurality of oxygen concentration sensors S2 are disposed in distribution at a plurality of positions inside the storage space, the controller H can be configured to control the operation of the introducing device N to stop feeding of the inactive gas to the container 50 if the oxygen concentration detected by any one of the plurality of oxygen concentration detecting sensors S2 has fallen below the set value.

Figure 5:
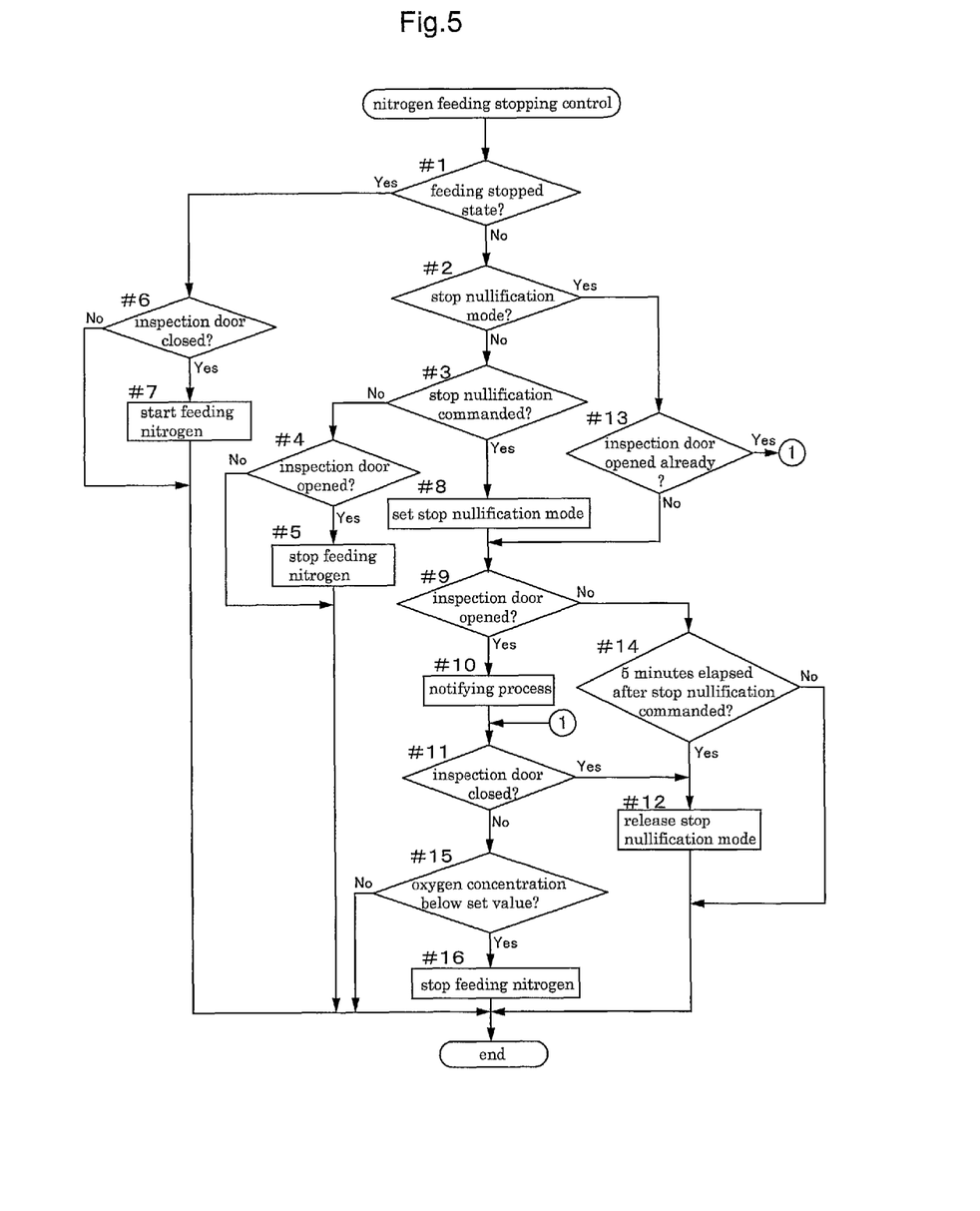
FIG. 5 is a flowchart showing control operations.

Next, with reference to FIG. 5, additional explanation on the feeding state controlling step executed by the controller H will be given. At this feeding state controlling step, the process for the nitrogen feeding stopping control and the process for the ancillary control described above are effected.

Firstly, it is determined whether the current state is the feeding stopped state where feeding of nitrogen gas to the container 50 stored in the storage section 10S is stopped or not (step #1). If it is determined that the current state is not the feeding stopped state, it is then determined whether the stop nullification mode is currently being executed or not (step #2).

If it is determined at step #2 that the stop nullification mode is not currently executed, that is, the normal stop mode is currently executed, it is then determined whether a stop nullification command was issued from the stop nullification commanding switch SW or not (step #3).

It is determined at step #3 that no stop nullification command was issued, then, it is determined whether the inspection door 55 was opened or not (step #4). If it is determined that the inspection door 55 was opened, a nitrogen feeding sopping process for stopping feeding of nitrogen gas to the containers 50 is executed (step #5) and then, the process proceeds to the process at step #1.

Further, also in case it is determined at step #4 that the inspection door 55 was not opened, the process proceeds to the process at step #1.

Incidentally, the nitrogen feeding stopping process at step #5 is a process of setting zero for the target feed rates to be commanded to the plurality of mass flow controllers 40 provided in correspondence with the plurality of storage sections 10S.

If it is determined at step #1 that the current state is a feeding stopped state, then, it is determined whether the inspection door 55 is closed or not (step #6). If it is determined that the inspection door 55 is currently closed, then the process executes a nitrogen feeding starting process for starting feeding of nitrogen gas to the containers 50 (step #7) and then, the process proceeds to the process at step #1.

Further, also in case it is determined at step #6 that the inspection door 55 is not closed, the process proceeds to the process at step #1.

Incidentally, the nitrogen feeding starting process at step #7 is a process of setting target feed rates for storage for the target flow rates to be commanded to the plurality of mass flow controllers 40 provided in correspondence with the plurality of storage sections 10S.

If it is determined at step #3 that a stop nullification command was issued, then, the process executes a process for setting the stop nullification mode as the execution mode (step #8) and then, it is determined whether the inspection door 55 was opened or not (step #9).

If it is determined at step #9 that the inspection door 55 was opened, then, the process executes a notification process in which the communication device 57A is activated for transmitting a message indicating that the feeding of nitrogen gas is to be continued, to the portable terminal 57B carried by the worker (step #10).

After the execution of the process at step #10, it is determined whether the current state is the closed state of the inspection door 55 or not (step #11). If it is determined that the inspection door 55 is under the closed state, a process for releasing the stop nullification mode is executed (step #12). Thereafter, the process proceeds to the process at step #1.

Incidentally, the process at step #12 for canceling the stop nullification mode sets the normal stop mode as the execution mode.

If it is determined at step #11 that the inspection door 55 is not closed, then, it is determined whether the oxygen concentration detected by the oxygen concentration detecting sensor S2 is below the set value or not (step #15).

If it is determined at step #15 that the concentration is below the set value, then, the process executes the nitrogen feeding stopping process for stopping feeding of nitrogen gas to the containers 50 (step #16) and thereafter, the process proceeds to the process at step #1.

Further, also in case it is determined at step #15 that the oxygen concentration is not below the set value, the process proceeds to the process at step #1.

Incidentally, the nitrogen feeding stopping process at step #16 is a process of setting zero for the target feed rates to be commanded to the plurality of mass flow controllers 40 provided in correspondence with the plurality of storage sections 10S, similarly to the process at step #05.

If it is determined at step #9 that the inspection door 55 is not opened, then, it is determined whether 5 minutes have elapsed after the issuance of the stop nullification command or not (step #14). If it is determined that 5 minutes have elapsed after the issuance of the stop nullification command, the process executes the process of releasing the stop nullification mode at step #12 and then, the process proceeds to the process at step #1.

Further, also in case it is determined at step #14 that 5 minutes have not yet elapsed after the issuance of the stop nullification command, the process proceeds to the process at step #1.

If it is determined at step #2 that the current mode is the stop nullification mode, then, it is determined whether the inspection door 55 was already opened after the setting of the stop nullification mode or not (step #13).

If it is determined at step #13 that the inspection door 55 was opened already, the process proceeds to the process at step #11. Whereas, if it is determined at step #13 that the inspection door 55 was not opened, then, the process proceeds to the process at step #9.

As described above, according to the instant embodiment, when the container 50 is stored in the storage section 10S, an amount of nitrogen gas is introduced to the inside of the container 50, so that the semiconductor wafer W accommodated in the container can be maintained under an appropriate state.

Moreover, in the normal stop mode, in order to restrict the consumption amount of nitrogen gas or reduction of oxygen concentration inside the storage space at the time of inspection operation, if the inspection door 55 for allowing access by the worker to/from the inside of the storage space was opened, basically, feeding of nitrogen gas to the containers 50 by the introducing device N is stopped. In contrast, in the stop nullification mode, even if the inspection door 55 was opened, feeding of nitrogen gas can be continued. Hence, an inspection operation can be carried out with feeding of nitrogen gas to the containers 50 stored in the storage sections 10S being continued.

[Other Embodiments]

(1) In the foregoing embodiment, there was disclosed the exemplary arrangement using nitrogen gas as an inactive gas. However, as the inactive gas, various kinds of gas such as argon can be used. Incidentally, it is required for the inactive gas used in the present invention that the gas have a low oxygen content and a low absolute humidity.

(2) In the foregoing embodiment, there was disclosed the exemplary arrangement in which the introducing device N includes, as the principal components thereof, the nitrogen gas feed source, the discharge nozzle 10i and the mass flow controller 40. However, the embodiment of the present invention is not limited thereto. For instance, the invention may be embodied in such a manner that the mass flow controller 40 is not provided, but a nitrogen gas feeding path incorporates a feed rate adjusting valve for varying the feed rate to the container 50 and a feed rate sensor for determining the feed rate to the container 50, such that the controller H controls the operation of the feed rate adjusting valve based on detection information of the feed rate sensor.

In this case, the introducing device N is to include the nitrogen gas feed source, the discharge nozzle 10i and the feed rate adjusting valve, as its principal components.

(3) In the foregoing embodiment, in the normal stop mode, when the inspection door 55 was opened, feeding of nitrogen gas to the containers 50 is stopped by commanding zero target feed rates to the mass flow controllers 40 provided respectively in correspondence with the plurality of storage sections 10S. However, the embodiment of the present invention is not limited thereto. Various arrangements can be employed instead for stopping feeding of nitrogen gas to the container 50, such as an arrangement wherein feeding of nitrogen gas to the containers 50 is stopped by effecting a closing operation of a feeding off/on valve mounted in the nitrogen feed source.

(4) In the foregoing embodiment, there was shown the exemplary arrangement wherein in feeding nitrogen gas as inactive gas to the container 50 stored in the storage section 10S, the nitrogen gas is fed with selectively setting the target feed rate for storage between the initial target feed rate and the steady-state target feed rate smaller than the initial target feed rate. However, the embodiment of the present invention is not limited thereto. For instance, nitrogen gas may be fed with maintaining the target feed rate for storage to one set feed rate.

(5) In the foregoing embodiment, there was shown the exemplary arrangement wherein a communication device 57A for transmitting a message to the portable terminal 57B of the worker is employed as the notifying device for notifying the worker of continuation of feeding of inactive gas. However, the embodiment of the present invention is not limited thereto. For instance, the specific construction of the notifying device may vary in many ways, such as providing, as a notifying device, a speaker disposed adjacent the inspection door 55 for outputting the message in the form of a voice message.

The invention claimed is:

1. An inactive gas introducing facility comprising:
a storage shelf disposed in a storage space partitioned from the outside and having storage sections each storing a container for accommodating a substrate;
an introducing device for introducing inactive gas to the inside of the container stored in the storage section through a gas feed opening of the container with discharging gas present inside the container to the inside of the storage space through a gas discharge opening of the container;
a controller for controlling operation of the introducing device;
an inspection-door opening/closing detecting device for detecting an opened/closed state of an inspection door allowing access of a worker to/from the inside of the storage space; and
a manual operation type stop nullification commanding device for issuing a stop nullification command to the controller;
wherein in a normal stop mode which is executed when the stop nullification command is not issued by the stop nullification commanding device, the controller controls the operation of the introducing device to stop feeding of inactive gas to the container if the inspection-door opening/closing detecting device detects an opened state of the inspection door; and in a stop nullification mode which is executed when the stop nullification command is issued by the stop nullification commanding device, the controller controls the operation of the introducing device to continue feeding of inactive gas to the container even if the inspection-door opening/closing detecting device detects the opened state of the inspection door.

2. The inactive gas introducing facility according to claim 1, wherein:

there is provided an oxygen concentration detecting sensor for detecting an oxygen concentration inside the storage space; and if the oxygen concentration detecting sensor detects an oxygen concentration below a set value while feeding of inactive gas to the container is continued in the stop nullification mode, the controller controls the operation of the introducing device to stop feeding of the inactive gas to the container.

3. The inactive gas introducing facility according to claim 1, wherein in the stop nullification mode, when feeding of inactive gas to the container is to be continued after detection of the opened state of the inspection door by the inspection-door opening/closing detecting device, the controller activates a notifying device for notifying continuation of feeding of inactive gas to the worker.

4. The inactive gas introducing facility according to claim 1, wherein if the inspection-door opening/closing detecting device does not detect the opened state of the inspection door even after lapse of a set period after switchover to the stop nullification mode in response to the stop nullification command from the stop nullification commanding device, the controller releases the stop nullification mode and switches it over to the normal stop mode.

5. The inactive gas introducing facility according to 4, wherein the stop nullification commanding device includes an operational member selectively operable between an operation canceling position and a nullification commanding position and urged to return to the operation canceling position; and the stop nullification command is issued to the controller when the operational member is operated to the nullification commanding position.

6. An inactive gas introducing method utilizing an inactive gas introducing facility comprising the steps of:

providing an inactive gas introducing facility, comprising:
a storage shelf disposed in a storage space partitioned from the outside and having storage sections each storing a container for accommodating a substrate;
an introducing device for introducing inactive gas to the inside of the container stored in the storage section through a gas feed opening of the container with discharging gas present inside the container to the inside of the storage space through a gas discharge opening of the container;
a controller for controlling operation of the introducing device;
an inspection-door opening/closing detecting device for detecting an opened/closed state of an inspection door allowing access of a worker to the inside of the storage space; and
a manual operation type stop nullification commanding device for issuing a stop nullification command to the controller; and effecting a feeding state controlling step with the controller, wherein in a normal stop mode which is executed when the stop nullification command is not issued by the stop nullification commanding device, the operation of the introducing device is controlled to stop feeding of inactive gas to the container if the inspection-door opening/closing detecting device detects an opened state of the inspection door; and wherein in a stop nullification mode which is executed when the stop nullification command is issued by the stop nullification commanding device, the operation of the introducing device is controlled to continue feeding of inactive gas to the container even if the inspection-door opening/closing detecting device detects the opened state of the inspection door.

7. The inactive gas introducing method according to claim 6, wherein:

the inactive gas introducing facility further includes an oxygen concentration detecting sensor for detecting an oxygen concentration inside the storage space; and at the feeding state controlling step, if the oxygen concentration detecting sensor detects an oxygen concentration below a set value while feeding of inactive gas to the container is continued in the stop nullification mode, the operation of the introducing device is controlled to stop feeding of the inactive gas to the container.

8. The inactive gas introducing method according to claim 6, wherein at the feeding state controlling step, when feeding of inactive gas to the container is to be continued after detection of the opened state of the inspection door by the inspection-door opening/closing detecting device, a notifying device is activated for notifying the continuation of feeding of inactive gas to the worker.

9. The inactive gas introducing method according to claim 6, wherein at the feeding state controlling step, if the inspection-door opening/closing detecting device does not detect the opened state of the inspection door even after lapse of a set period after switchover to the stop nullification mode in response to the stop nullification command from the stop nullification commanding device, the stop nullification mode is released and then switched over to the normal stop mode.

10. The inactive gas introducing method according to claim 9, wherein the stop nullification commanding device includes an operational member selectively operable between an operation canceling position and a nullification commanding position and urged to return to the operation canceling position; and the stop nullification command is issued to the controller when the operational member is operated to the nullification commanding position.

* * * * *

UNITED STATES PATENT AND TRADEMARK OFFICE
CERTIFICATE OF CORRECTION

| | | |
|---|---|---|
| PATENT NO. | : 9,064,921 B2 | Page 1 of 1 |
| APPLICATION NO. | : 13/733393 | |
| DATED | : June 23, 2015 | |
| INVENTOR(S) | : Takeshi Shin et al. | |

It is certified that error appears in the above-identified patent and that said Letters Patent is hereby corrected as shown below:

Claims

Column 15, Line 37, Claim 5, delete "4," and insert -- claim 4, --

Signed and Sealed this
Twelfth Day of January, 2016

Michelle K. Lee
*Director of the United States Patent and Trademark Office*